(12) United States Patent
Furuichi et al.

(10) Patent No.: US 8,436,407 B2
(45) Date of Patent: May 7, 2013

(54) PHOTOELECTRIC CONVERSION DEVICE AND IMAGING SYSTEM USING PHOTOELECTRIC CONVERSION DEVICE

(75) Inventors: Aiko Furuichi, Sagamihara (JP); Shigeru Nishimura, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 337 days.

(21) Appl. No.: 12/168,492

(22) Filed: Jul. 7, 2008

(65) Prior Publication Data

US 2009/0020796 A1    Jan. 22, 2009

(30) Foreign Application Priority Data

Jul. 20, 2007  (JP) ................................. 2007-189448

(51) Int. Cl.
*H01L 31/062* (2012.01)
(52) U.S. Cl.
USPC .................................. 257/292; 257/E27.133
(58) Field of Classification Search .................. 257/292, 257/E27.133
See application file for complete search history.

(56) References Cited

U.S. PATENT DOCUMENTS

| | | | |
|---|---|---|---|
| 6,169,317 B1 | 1/2001 | Sawada et al. | 257/435 |
| 7,012,240 B2 | 3/2006 | Yaung | 250/214.1 |
| 7,180,049 B2 * | 2/2007 | Yaung | 250/214.1 |
| 7,259,361 B2 | 8/2007 | Nishimura | 250/208.1 |
| 7,411,170 B2 | 8/2008 | Shimotsusa et al. | 250/208.1 |
| 7,749,788 B2 | 7/2010 | Okagawa et al. | 438/48 |
| 8,053,855 B2 | 11/2011 | Nam et al. | |
| 2004/0016935 A1 | 1/2004 | Kubota et al. | 257/98 |
| 2004/0080650 A1 * | 4/2004 | Hwang et al. | 348/308 |
| 2005/0040317 A1 | 2/2005 | Yaung | |
| 2005/0280007 A1 * | 12/2005 | Hsu et al. | 257/79 |
| 2007/0045511 A1 * | 3/2007 | Lee et al. | 250/208.1 |
| 2008/0029793 A1 | 2/2008 | Watanabe et al. | 257/291 |
| 2008/0054388 A1 | 3/2008 | Nakata et al. | 257/432 |

FOREIGN PATENT DOCUMENTS

| | | |
|---|---|---|
| JP | 6-224398 A | 8/1994 |
| JP | 2001-267544 A | 9/2001 |
| JP | 2003-060179 A | 2/2003 |
| JP | 2005-333131 A | 12/2005 |
| JP | 2006-191000 A | 7/2006 |

OTHER PUBLICATIONS

Office Action dated Sep. 18, 2012, in Japanese Application No. 2007-189448.

* cited by examiner

*Primary Examiner* — Lex Malsawma
(74) *Attorney, Agent, or Firm* — Fitzpatrick, Cella, Harper & Scinto

(57) ABSTRACT

A photoelectric conversion device includes photoelectric conversion elements and element isolation regions, both of which are arranged on a semiconductor substrate. The photoelectric conversion device further includes a plurality of interlayer insulation layers including a first interlayer insulation layer arranged nearest to the semiconductor substrate, and a second interlayer insulation layer arranged to cover the first interlayer insulation layer. Gaps extending from at least the second interlayer insulation layer to the first interlayer insulation layer are arranged in first and second interlayer insulation layer regions corresponding to the element isolation regions.

14 Claims, 6 Drawing Sheets

PHOTOELECTRIC CONVERSION DEVICE AND IMAGING SYSTEM USING PHOTOELECTRIC CONVERSION DEVICE

BACKGROUND OF THE INVENTION

1. Field of the Invention

The present invention relates to a photoelectric conversion device.

2. Description of the Related Art

The miniaturization of a pixel (photoelectric conversion element) of a photoelectric conversion device has rapidly progressed owing to the spread of a small-sized light digital camera and a mobile phone with a camera function. Because an incident light into a photoelectric conversion element has decreased as the progress of the miniaturization, the improvement of the sensitivity of the photoelectric conversion element has been required. In order to improve the sensitivity, it has been examined to enlarge the area of the light receiving portion of a photoelectric conversion element to improve the aperture ratio thereof. However, if the area of the light receiving portion is enlarged, then the occurrence of color mixture, the so-called crosstalk, owing to the mixing of a light into an adjacent photoelectric conversion element becomes easy. In particular, in a metal oxide semiconductor (MOS) type photoelectric conversion device including a multilayered wiring structure, the distance from the uppermost surface of the multilayered wiring structure to the light receiving surface of a photoelectric conversion element becomes longer, and the crosstalk is easily generated. As a measure for the crosstalk, a structure of forming an air gap in an insulation layer disposed between metal wiring layers is disclosed in U.S. Pat. No. 7,012,240.

SUMMARY OF THE INVENTION

A photoelectric conversion device of the present invention includes: a semiconductor substrate wherein a photoelectric conversion element, and an element isolation region electrically isolating the photoelectric conversion element from an element adjacent to the photoelectric conversion element are arranged; a plurality of interlayer insulation layers including a first interlayer insulation layer and a second interlayer insulation layer arranged to cover the first interlayer insulation layer; and a plurality of wiring layers including a wiring layer arranged nearest to the semiconductor substrate and arranged between the first and second interlayer insulation layers, wherein a lower refractive index region extending from the first interlayer insulation layer into the second interlayer insulation layer and having a refractive index lower than those of the first and second interlayer insulation layers is arranged, within the first and second interlayer insulation layers in a plane perpendicular to a surface of the semiconductor substrate, in an area corresponding to the element isolation region in a plane parallel to the surface of the semiconductor substrate.

Other features and advantages of the present invention will be apparent from the following description taken in conjunction with the accompanying drawings, in which like reference characters designate the same or similar parts throughout the figures thereof.

Figure 1A:
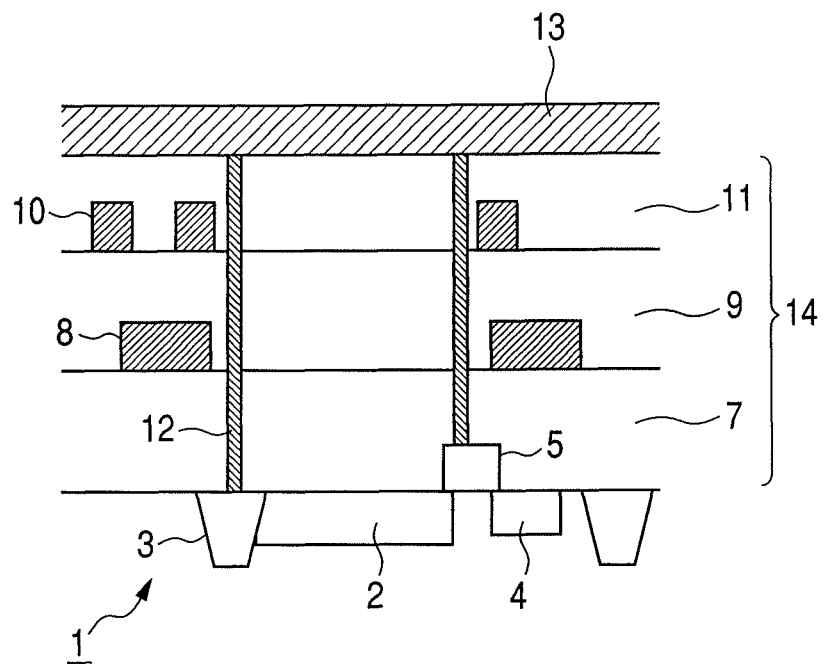
FIG. 1A is a typical sectional view of a photoelectric conversion device of a first embodiment.

The accompanying drawings, which are incorporated in and constitute a part of the specification, illustrate embodiments of the invention and, together with the description, serve to explain the principles of the invention.

DESCRIPTION OF THE EMBODIMENTS

The photoelectric conversion device of the present invention includes a gap in a laminated interlayer insulation layer and a structure of guiding an incident light to a photoelectric conversion element by the gap. The gap has a depth extending from an interlayer insulation layer arranged at a second layer from the top surface of a semiconductor substrate to at least an interlayer insulation layer nearest to the semiconductor substrate. Then, the planar position at which the gap is arranged is a region corresponding to an element isolation region arranged around a photoelectric conversion element of the interlayer insulation layer. The element isolation region electrically isolates a photoelectric conversion element from an element adjacent to the photoelectric conversion element.

The air gap is not arranged to the neighborhood of a semiconductor substrate in the structure disclosed in U.S. Pat. No. 7,012,240. Consequently, an incident light enters the adjacent pixel in the neighborhood of the semiconductor substrate, and the incident light leads to the generation of crosstalk. Moreover, because no examination is given to the damage to the photoelectric conversion elements, which damage occurs at the time of forming the air gap, the technique disclosed in U.S. Pat. No. 7,012,240 has the possibility of generating dark currents at the time of forming the gap. Accordingly, the present invention aims to provide a photoelectric conversion device capable of decreasing the mixing of a light into an adjacent photoelectric element and further capable of decreasing the damage to the photoelectric conversion elements.

In the present invention, by forming the gap to be deeper to the depth near to the surface of the light receiving portion in comparison with the related art, the crosstalk in the neighborhood of the semiconductor substrate can be decreased. Moreover, by arranging the gap in the region corresponding to the element isolation region of the interlayer insulation layer, the damage to the photoelectric conversion elements, which damage occurs at the time of forming the gap, can be decreased. That is, even if the gap is formed to the depth near to the photoelectric conversion element, the damage to the photoelectric conversion element can be decreased.

The gap is arranged along the lamination direction of a plurality of interlayer insulation layers over a plurality of interlayer insulation layers. The gap includes a gas therein, and the gas has a lower refractive index in comparison with those of the interlayer insulation layers. The gap has a function of reflecting an incident light by using a refractive index difference at an interface between the gas in the gap and a plurality of interlayer insulation layers. As the gas, an air may be used. The gap can be called as an air gap. The gap is arranged in the interlayer insulation layers, and an insulation layer may be arranged at the upper part of the interlayer insulation layers to cover the upper part of the gap. The gap may include a material not being a gas and having a lower refractive index, and the gap can be thus called as a lower refractive region.

Moreover, the interlayer insulation layer is a layer for insulating an active region and a gate electrode that are arranged on the semiconductor substrate from a wiring layer, or for insulating a wiring layer from another wiring layer. The structure of the interlayer insulation layer may be the one in which one layer thereof is made of a one-layer film or the laminated one in which one layer thereof is made of two-or-more-layer films. In view of the function of the interlayer insulation layer, a film insulating neighboring two layers of conductive materials (or semiconductors) is set as one unit of the interlayer insulation layer.

In the following, the present invention will be described in detail by exemplifying embodiments. In the present specification, a semiconductor substrate includes a case where a material substrate is processed. For example, a member in the state in which one or a plurality of semiconductor regions are formed, a member on the way of a series of manufacturing process, or a member subjected to a series of manufacturing process can be also called as a semiconductor substrate. Moreover, a direction from the primary surface of a semiconductor substrate to the inside thereof is supposed to a lower direction, and the reverse direction thereof is supposed to an upper direction.

In the following, the embodiments of the present invention will be described in detail with reference to the attached drawings.

Circuit Configuration of Pixel

Figure 6:
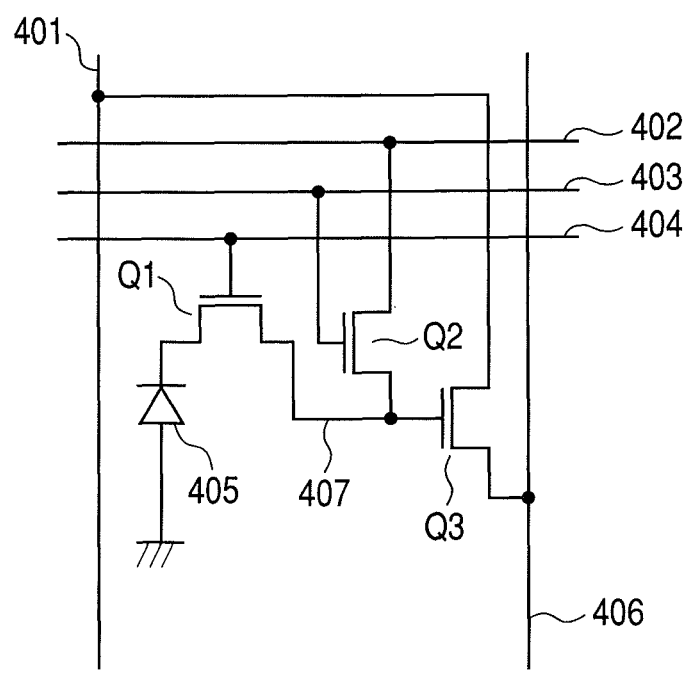
FIG. 6 is a diagram of an example of a pixel circuit.

First, an example of the circuit configuration of a pixel of a photoelectric conversion device is shown in FIG. 6. The pixel circuit includes a photoelectric conversion element 405, which is a photodiode. The configuration is the one including one photoelectric conversion element in a pixel. The pixel circuit includes a transfer MOS transistor Q1 transferring the carriers of the photoelectric conversion element 405, a floating diffusion region (FD region) 407, through which the carriers are transferred, and an amplifying MOS transistor Q3, the gate electrode of which is connected to the FD region 407. The amplifying MOS transistor Q3 constitutes a part of a source follower circuit. The pixel circuit further includes a resetting MOS transistor Q2 resetting the FD region 407 and the photoelectric conversion element 405 to predetermined potential severally. The pixel circuit further includes a transfer switch line 404 for driving the transfer MOS transistor Q1, and a reset switch line 403 for driving the resetting MOS transistor Q2. The pixel circuit further includes a reset power supply line 402 for supplying a voltage to the drain portion of the resetting MOS transistor Q2. The reset power supply line 402 supplies the voltage having at least two values in the present circuit configuration. The pixel circuit further includes a power supply line 401 for supplying a voltage to the drain portion of the amplifying MOS transistor Q3, and a signal output line 406 for the amplifying MOS transistor Q3 to output a signal based on the potential of the gate electrode thereof. The pixel circuit is formed in the configuration like this.

In the following, concrete embodiments will be described while focusing the description on the photoelectric conversion element 405, the transfer MOS transistor Q1, and the FD region 407 in FIG. 6.

First Embodiment

In the photoelectric conversion device of the present embodiment, a gap is disposed in the insulating layers of a multilayered wiring structure. Then, the gap is arranged to the semiconductor substrate side of a wiring layer arranged nearest to the semiconductor substrate among a plurality of wiring layers. In other words, the gap can be expressed to be formed at the depth of from at least a second interlayer insulation layer laminated at a second layer among interlayer insulation layers laminated on the semiconductor substrate to a first interlayer insulation layer arranged near to the semiconductor substrate.

Figure 1B:
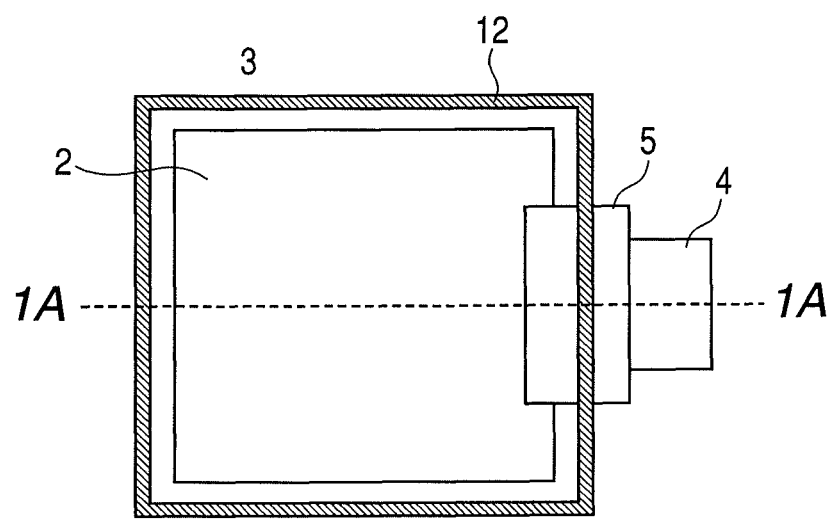
FIG. 1B is a typical plan view of the photoelectric conversion device of the first embodiment.

FIGS. 1A and 1B illustrate a typical sectional view and a typical plan view, respectively, which illustrates the periphery of a photoelectric conversion element of the photoelectric conversion device of the present embodiment. FIG. 1A illustrates the cross section taken along a line 1A-1A of FIG. 1B. First, the configuration of the photoelectric conversion element is described with reference to FIG. 1A. The photoelectric conversion device includes a first conductive type semiconductor substrate 1. The kind of the semiconductor substrate 1 is supposed to be silicon. Moreover, the semiconductor substrate 1 may be a first conductive type semiconductor region formed in a semiconductor substrate. The photoelectric conversion device includes a second conductive type semiconductor region 2 arranged on the semiconductor substrate 1. The semiconductor substrate 1 and the semiconductor region 2 constitute a photoelectric conversion element. Because the semiconductor region 2 accumulates carriers (electrons here) generated by photoelectric conversion, the semiconductor region 2 is also called as a carrier accumulation region. Furthermore, the photoelectric conversion device includes an element isolation region 3 for electrically isolating the photoelectric conversion element from the other circuit elements. The element isolation region 3 is arranged so as to enclose the photoelectric conversion element in order to electrically isolate the photoelectric conversion element. The shallow trench isolation (STI) is used as the structure of the element isolation region 3, but the other structures, such as the local oxidation of silicon (LOCOS), may be used. The element isolation region 3 generally performs the insulation between adjacent elements in the semiconductor substrate 1 by disposing an isolator such as silicon oxide. The photoelectric conversion device further includes a second conductive type semiconductor region 4, which is also called as a floating diffusion region (FD region). The photoelectric conversion device further includes a gate electrode 5 of a transfer MOS transistor transferring the carriers in the semiconductor region 2 to the semiconductor region 4, and the gate electrode 5 is made of, for example, polysilicon. Then, a multilayered wiring structure 14 is arranged on the semiconductor substrate 1. In the multilayered wiring structure 14, a plurality of interlayer insulation layers, each made of, for example, silicon oxide, is laminated, and the multilayered wiring structure 14 includes a plurality of wiring layer, which is electrically insulated by the interlayer insulation layers. To put it concretely, the multilayered wiring structure 14 includes a first interlayer insulation layer 7, a second interlayer insulation layer 9, a third interlayer insulation layer 11, a first wiring layer 8, and a second wiring layer 10.

In an arrangement on a plane parallel to the surface of the semiconductor substrate 1, a gap 12 is arranged in a region corresponding to the element isolation region 3. Then, in an arrangement on a plane perpendicular to the surface of the semiconductor substrate 1, the gap 12 is arranged to the upper part of the second wiring layer 10 corresponding to the uppermost wiring layer of the multilayered wiring structure 14, and a protective film 13 made of a silicon nitride film is arranged on the upper part of the gap 12. Although the gap 12 penetrates the third interlayer insulation layer 11 and the second interlayer insulation layer 9 in FIG. 1A, the gap 12 may reach at least the first interlayer insulation layer 7 through the second interlayer insulation layer 9. In the present embodiment, it can be said that the gap 12 penetrates the second interlayer insulation layer 9 to reach at least the first interlayer insulation layer 7. Incidentally, the plane means the one parallel to the surface of the semiconductor substrate 1, and the cross section means a plane perpendicular to the surface of the semiconductor substrate 1. The direction perpendicular to the surface of the semiconductor substrate 1 is also called as a lamination direction.

Here, a description is given to the planar arrangement of the gap 12 with reference to FIG. 1B. In FIG. 1B, the illustration of the wiring layers 8 and 10 and the like are omitted for simplification. First, the element isolation region 3 is arranged to enclose the semiconductor region 2 constituting the photoelectric conversion element. The element isolation region 3 is not arranged on the channel portion of the transfer MOS transistor partially. The part of the photoelectric conversion element where a light can enter is made to be a light receiving portion, and is illustrated as the semiconductor region 2 for simplification in the present embodiment. Then, the gap 12 is arranged in the region corresponding to the element isolation region 3 in the interlayer insulation films. That is, the gap 12 is arranged to enclose the photoelectric conversion element in a plane. By the adoption of the foregoing configuration, the damage to the photoelectric conversion element at the time of forming the gap 12 can be decreased without decreasing the area of the light receiving portion of the photoelectric conversion element. Furthermore, a part of the gap 12 is arranged on the gate electrode 5. By the adoption of the configuration, the damage to the photoelectric conversion element can be decreased, and the light entering the FD region 4 can be decreased. Alternatively, the gap 12 may be formed in the region corresponding to the element isolation region 3 enclosing the FD region 4. Also by the adoption of the foregoing structure, at least the leaking of an incident light into an adjacent pixel can be decreased. However, the configuration of the present embodiment is more preferable for decreasing the light entering the FD region 4.

Moreover, by the technique disclosed in the U.S. Pat. No. 7,012,240, the diffraction of a light is caused at the end of the gap, but no diffraction is caused in the configuration of the present embodiment. Consequently, the present embodiment can improve light condensing efficiency in comparison with the technique of U.S. Pat. No. 7,012,240.

A manufacturing method of the photoelectric conversion device of the present embodiment is simply described. First, semiconductor elements and the element isolation regions 3 are formed on the semiconductor substrate 1. After that, the multilayered wiring structure 14 is formed on the semiconductor substrate 1. Then, the gaps 12 are formed at the positions corresponding to the element isolation regions 3 enclosing the photoelectric conversion elements, respectively, in the multilayered wiring structure 14. The gaps 12 can be formed by the following process. First, a pattern made of a photoresist is disposed on the third interlayer insulation layer 11 by using a photolithographic technique. Then, dry etching is performed to the first interlayer insulation layer 7, the second interlayer insulation layer 9, and the third interlayer insulation layer 11 by using the pattern as a mask, and consequently the gaps 12 are formed in the state of penetrating the plurality of interlayer insulation layers 7, 9, and 11 severally. At this time, the control of the etching is performed on the basis of the speed and the time of the etching. Although the gap 12 is formed to the semiconductor substrate 1, that is, is formed to penetrate the interlayer insulation layer 7 in FIG. 1A, the etching can be stopped in the first interlayer insulation film under a certain etching condition. However, the color mixture can be more decreased by stopping the etching at the stage of reaching the semiconductor substrate 1 to penetrate also the first interlayer insulation film.

After that, the protective film 13 made of a silicon nitride film is formed, and thereby the photoelectric conversion device of the present embodiment can be obtained. After that, color filters, micro lenses, and the like, may be disposed.

As described above, by the adoption of the configuration in which the base of the gap 12 is arranged to the neighborhood of the semiconductor substrate 1, the incidence of the light entering the photoelectric conversion device into an adjacent photoelectric conversion element can be decreased. Moreover, also the incidence of the light reflected by the semiconductor substrate 1 into the adjacent photoelectric conversion element can be decreased.

Furthermore, by the adoption of the arrangement of the gap 12 corresponding to the element isolation region 3, the etching damage to a photoelectric conversion element at the time of the formation of the gap 12 arranged to the neighborhood of the semiconductor substrate 1 can be decreased. Furthermore, a part of the gap 12 is arranged on the gate electrode 5, and consequently the damage to the photoelectric conversion element at the time of forming the gap 12 can be decreased. Consequently, the increase of a dark current caused by the formation of the gap 12 can be decreased.

Second Embodiment

Figure 2:
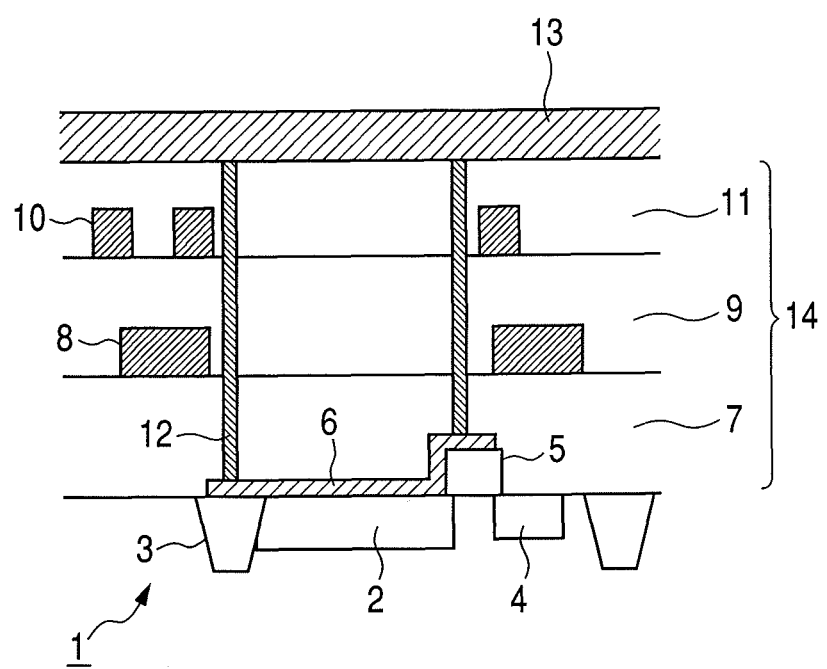
FIG. 2 is a typical sectional view of a photoelectric conversion device of a second embodiment.

A second embodiment is illustrated in FIG. 2. The present embodiment has a feature of adopting the configuration of further arranging an insulation film 6 in comparison with the first embodiment. Because the planar arrangement of the present embodiment is the same as that of the first embodiment, the description of the planer arrangement is omitted. Moreover, the descriptions of the configurations of the second embodiment of having the same functions as those of the first embodiment are omitted.

The insulation film 6 shown in FIG. 2 is a film arranged to cover at least the light receiving portion of a photoelectric conversion element and a part of the element isolation region 3, and the film has a refraction index of the value between that of the semiconductor substrate 1 and that of an interlayer insulation layer 7. The insulation film 6 is made of, for example, silicon nitride. The insulation film 6 functions as an antireflection film suppressing the reflection at the interface between the semiconductor substrate 1 and the interlayer insulation layer 7 in the light receiving portion of the photoelectric conversion element, and an incident light quantity to the photoelectric conversion element can be increased by the function of the insulation film 6.

Furthermore, the insulation film 6 can be used as an etching stop film at the time of the formation of the gap 12. The etching stop film means a film etched more slowly than an etching object in a certain etching condition. By providing the etching stop film, the gap 12 can be formed under better control in comparison with the case where the etching is controlled on the basis of time. Moreover, the damage to the photoelectric conversion element at the time of etching can be decreased. Also the damage to the element isolation region 3 can be decreased, and a dark current can be decreased more.

Here, the insulation film 6 may be arranged to the upper part of the gate electrode 5, and the insulation film 6 may be a single layer or may be laminated. The insulation film 6 may be formed by the lamination of, for example, silicon oxide and silicon oxynitride.

Third Embodiment

Figure 3A:
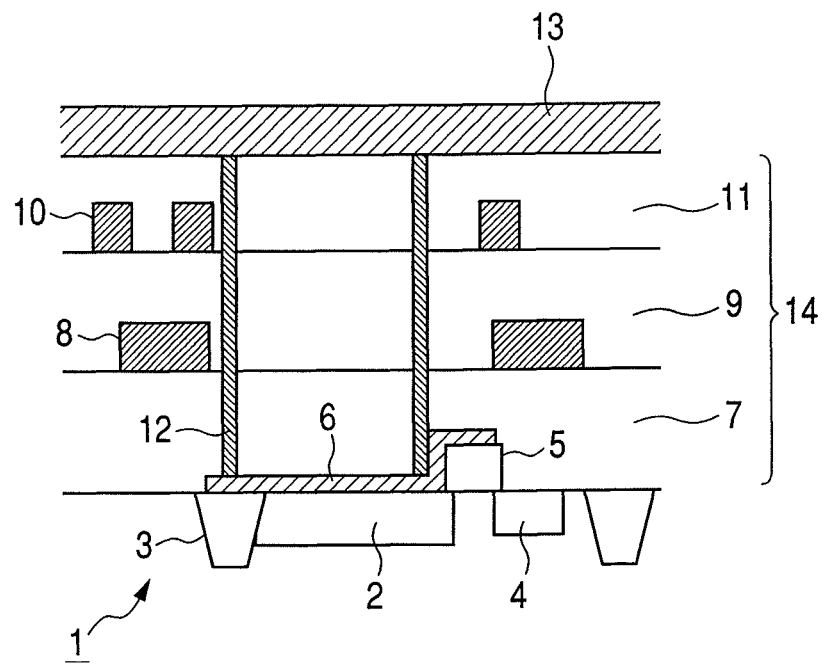
FIG. 3A is a typical sectional view of a photoelectric conversion device of a third embodiment.
Figure 3B:
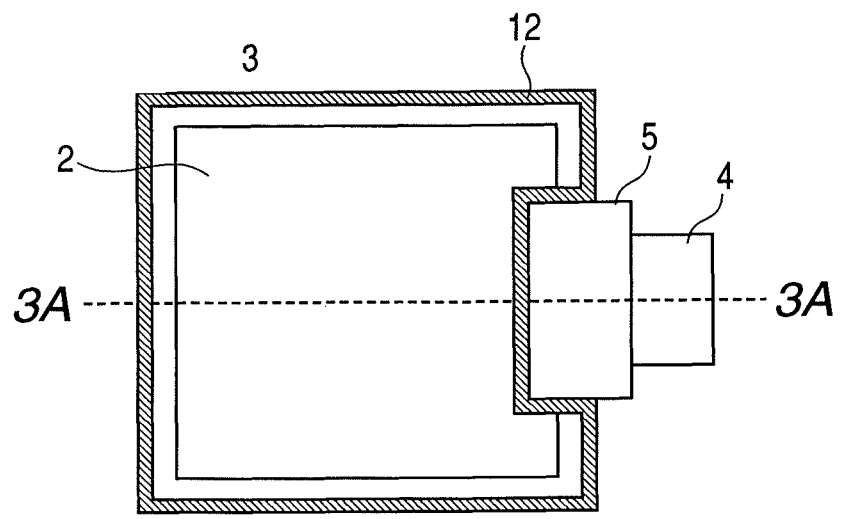
FIG. 3B is a typical plan view of the photoelectric conversion device of the third embodiment.

A third embodiment is illustrated in FIGS. 3A and 3B. The present embodiment is a modification of the second embodiment, and differs from the second embodiment in the planar arrangement of the gap 12. FIG. 3A is a typical sectional view illustrating the periphery of a photoelectric conversion element of a photoelectric conversion device of the present embodiment, and FIG. 3B illustrates the plan view of the photoelectric conversion element. FIG. 3A is a typical sectional view of the photoelectric conversion device of the present embodiment corresponding to a line 3A-3A of FIG. 3B. The descriptions of the configurations having the same functions as those of the first and second embodiments are omitted.

As shown in FIGS. 3A and 3B, the gap 12 is arranged on the photoelectric conversion element in the state of avoiding the gate electrode 5. By the adoption of the foregoing configuration, the light transmitting the gate electrode 5 to enter the FD region 4 can be decreased. Moreover, if the gap 12 is arranged on the photoelectric conversion element in the manner of the present embodiment, then the damage to the photoelectric conversion element at the time of forming the gap 12 can be decreased by arranging the insulation film 6 on the photoelectric conversion element.

Fourth Embodiment

Figure 4A:
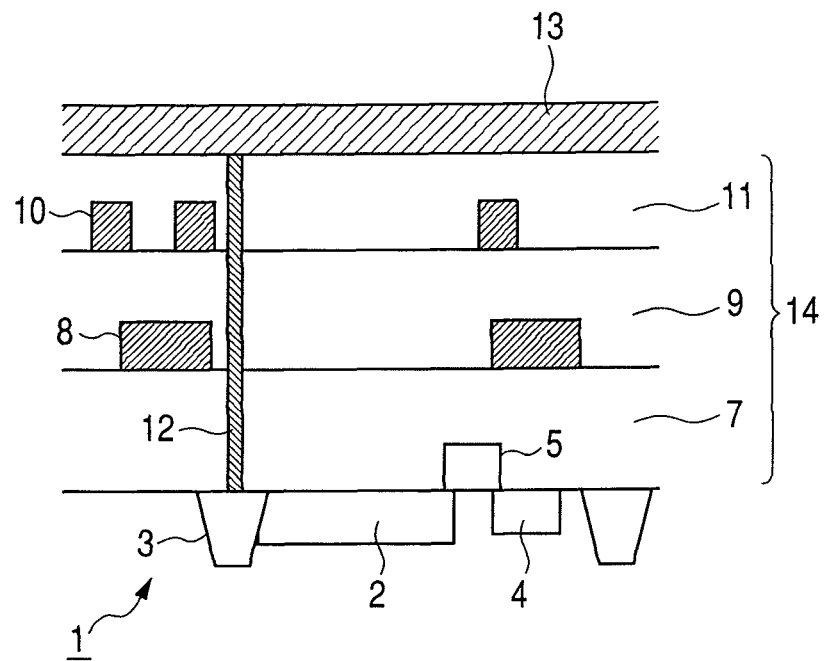
FIG. 4A is a typical sectional view of a photoelectric conversion device of a fourth embodiment.
Figure 4B:
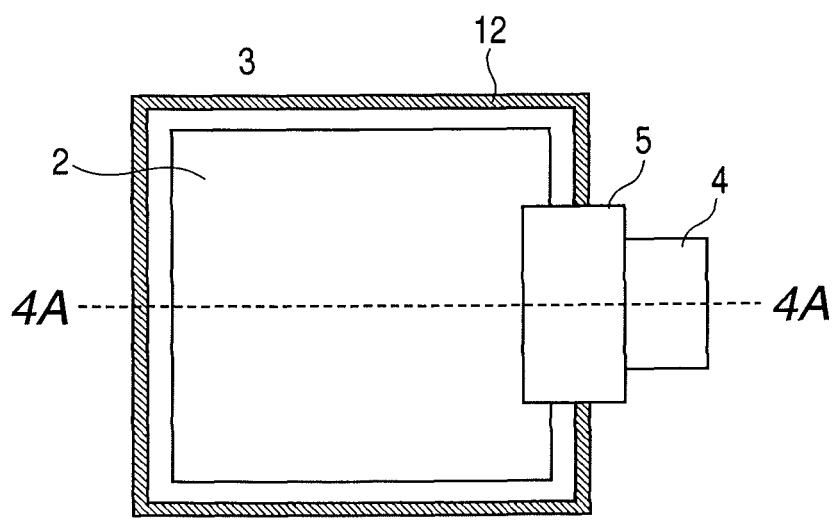
FIG. 4B is a typical plan view of the photoelectric conversion device of the fourth embodiment.

A fourth embodiment is illustrated in FIGS. 4A and 4B. The present embodiment is a modification of the first embodiment, and differs from the first embodiment in the planar arrangement of the gap 12. FIG. 4A is a typical sectional view illustrating the periphery of a photoelectric conversion element of the photoelectric conversion device of the present embodiment, and FIG. 4B illustrate a plan view of the periphery. FIG. 4A corresponds to the cross section at a line 4A-4A in FIG. 4B. The descriptions of the configurations that have been already described are omitted.

In FIG. 4B, the gap 12 is not arranged to enclose the photoelectric conversion element. That is, the gap 12 is not arranged on the side of the gate electrode 5. Also in FIG. 4A, the gap 12 is not arranged on the side of the gate electrode 5 correspondingly. By the adoption of the foregoing configuration, the damage to the gate electrode 5 and the photoelectric conversion element at the time of forming the gap 12 can be decreased.

Fifth Embodiment

Figure 5:
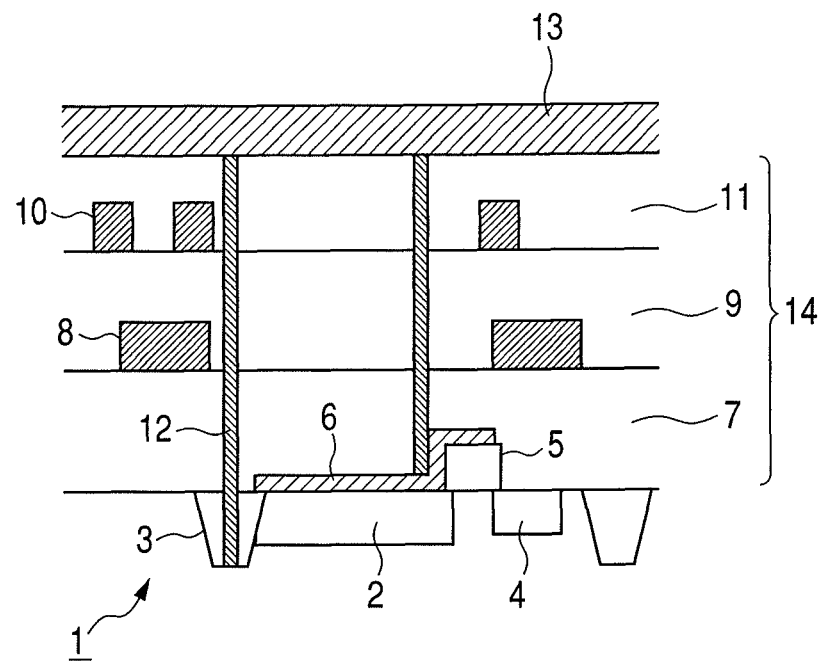
FIG. 5 is a typical sectional view of a photoelectric conversion device of a fifth embodiment.

A fifth embodiment is illustrated in FIG. 5. The different point of the present embodiment from the other embodiments is the arrangement of the gap 12 to the inside of the element isolation region 3. FIG. 5 is a typical sectional view illustrating the periphery of a photoelectric conversion element of the photoelectric conversion device of the present embodiment. The descriptions of the same configurations as those of the second embodiment are omitted.

The present embodiment has a feature of the penetration of the gap 12 to the interlayer insulation layer 7 to be arranged in the element isolation region 3. By the adoption of the foregoing configuration, the incidence of an incident light into an adjacent photoelectric conversion element can be decreased at a deep part of the semiconductor substrate 1.

Here, the insulation film 6 is formed not to contact with the gap 12, but the gap 12 may penetrate the insulation film 6. In an alternative embodiment, a structure without the insulation film 6 may be used. Here, if the gap 12 penetrates the element isolation region 3 to be arranged to the bottom of the element isolation region 3, then the etching for forming the gap 12 can be also controlled on the basis of the difference of the etching speeds between that of the silicon oxide of the element isolation region 3 and that of the silicon of the semiconductor substrate 1. Moreover, different from a configuration shown in FIG. 5, a bottom of the gap 12 may be arranged at a middle of the element isolation region 3.

Moreover, the gap 12 may penetrates the element isolation region 3 to be arranged into the semiconductor substrate 1. Because the gap 12 includes a gas, the arrangement of the gap 12 to penetrate the element isolation region 3 to be arranged into the semiconductor substrate 1 exerts little influence on the electric characteristics of the semiconductor region. By the adoption of the foregoing configuration, the arrangement of the gap 12 in the semiconductor substrate 1 enables the decrease of the occurrence of crosstalk in a deep part of the semiconductor substrate 1.

Application to Imaging System

Figure 7:
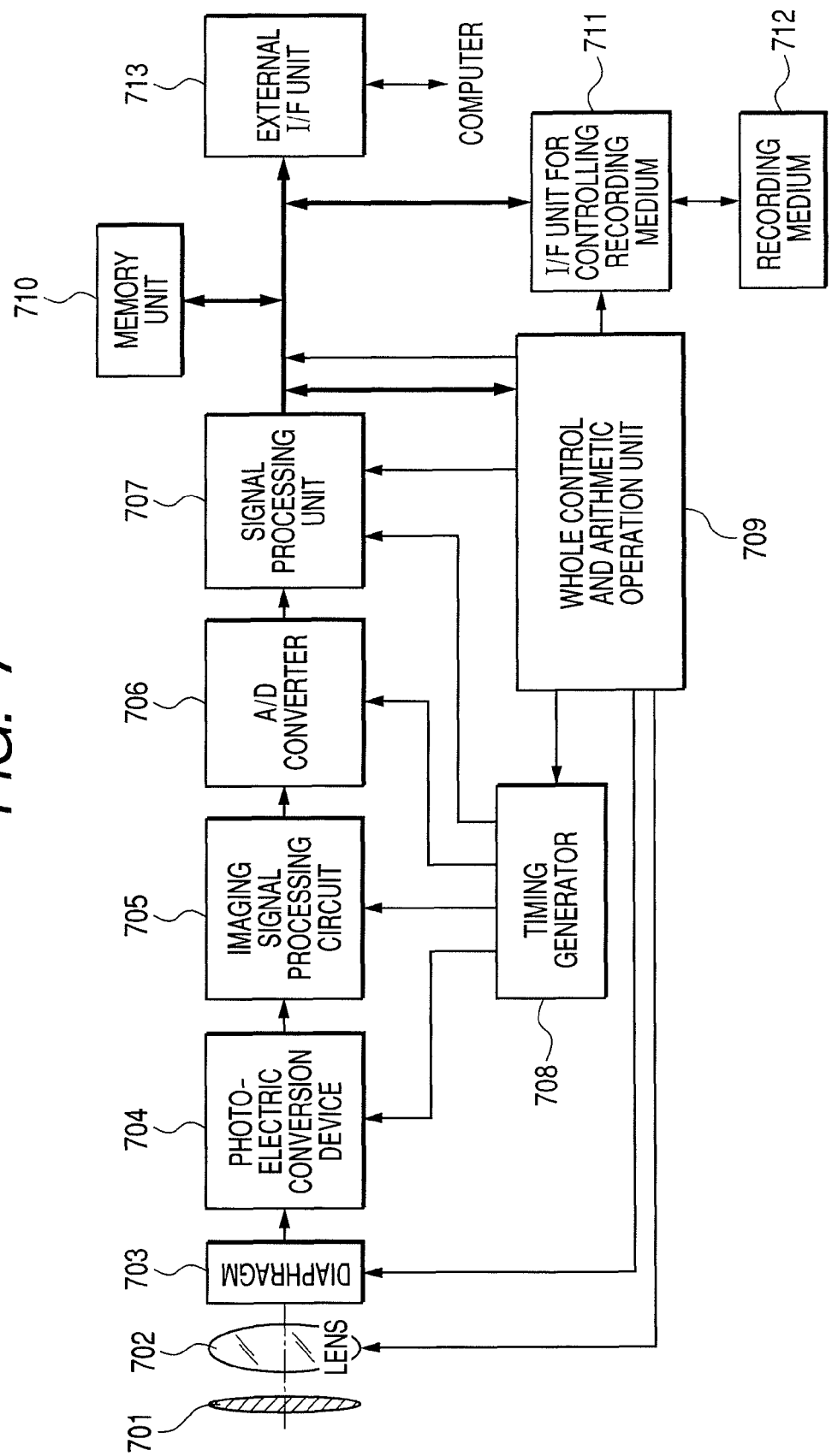
FIG. 7 is a block diagram of an imaging system.

A detailed description is given to an example of the case of applying the photoelectric conversion device of the present invention to an imaging system. FIG. 7 illustrates a block diagram of the case of applying the photoelectric conversion device to a digital still camera as an example of the imaging system.

In FIG. 7, the digital still camera includes a barrier 701 functioning as a protection of a lens and a main switch, the lens 702, and a diaphragm 703 for changing the quantity of the light that has passed through the lens 702. The digital still camera further includes a photoelectric conversion device 704 for taking an object formed as an image with the lens 702 therein as an imaging signal. The configuration for allowing the photoelectric conversion device 704 to perform image formation of an optical image of the object, which configuration includes the lens 702 and the diaphragm 703, is made as an optical system. The digital still camera further includes an analog-digital converter (A/D converter) 706 performing the analog-to-digital conversion of an imaging signal output from the photoelectric conversion device 704. The digital still camera further includes a signal processing unit 707 performing various corrections of the imaging data output from the A/D converter 706 and the compression of the imaging data. Then, the digital still camera further includes a timing generator 708 outputting various timing signals to the photoelectric conversion device 704, an imaging signal processing circuit 705, the A/D converter 706, and the signal processing unit 707. The digital still camera further includes a whole control and arithmetic operation unit 709 performing various operations and controlling the whole digital still camera. The digital still camera further includes a memory unit 710 for storing image data temporarily, an interface unit 711 for performing recording or reading against a recording medium, and the detachably attachable recording medium 712, such as a semiconductor memory, for performing the recording or the reading of imaging data. Then, the digital still camera further includes an interface unit 713 for communicating with an external computer and the like.

A description is given to the operation of the digital still camera of the aforesaid configuration at the time of photographing. When the barrier 701 is opened, the main power supply of the digital still camera is turned on, and the power supply of the control system is next turned on. Furthermore, the power supply of the imaging circuits such as the A/D converter 706 is turned on. Then, in order to control a light exposure, the whole control and arithmetic operation unit 709 makes the diaphragm 703 open. A signal output from the photoelectric conversion device 704 is converted by the A/D converter 706, and then is input into the signal processing unit 707. The whole control and arithmetic operation unit 709 performs the operation of an exposure on the basis of the data. The whole control and arithmetic operation unit 709 determines the brightness on the basis of the result of the photometry, and controls the diaphragm 703 according to the result of the determination.

Next, the whole control and arithmetic operation unit 709 takes out high frequency components on the basis of the signal output from the photoelectric conversion device 704, and performs the operation of a distance to the object. After that, the whole control and arithmetic operation unit 709 drives the lens 702 to determine whether the state is in-focus or not. When the whole control and arithmetic operation unit 709 determines that the state is not in-focus, the whole control and arithmetic operation unit 709 again drives the lens 702. Then, after the confirmation of in-focus, main exposure is started.

When the main exposure ends, an image signal output from the photoelectric conversion device 704 is subjected to the A/D conversion by the A/D converter 706, and passes through the signal processing unit 707 to be written into the memory unit 710 by the whole control and arithmetic operation unit 709. After that, the data stored in the memory unit 710 passes through the I/F unit 711 for controlling a recording medium and is recorded in the detachably attachable recording medium 712, such as a semiconductor memory, under the control of the whole control and arithmetic operation unit 709. Moreover, the data sometimes passes through the external I/F unit 713 to be input a computer or the like directly, and the processing of the image is sometimes performed.

In this way, the photoelectric conversion device of the present invention can be applied to the imaging system.

By applying the photoelectric conversion device of the present invention, imaging data having less crosstalk can be obtained. Consequently, succeeding signal processing and corrections becomes easy.

As described above, according to the photoelectric conversion device of the present invention, a photoelectric conversion device having decreased crosstalk and a dark current can be provided. Moreover, the circuit configurations and the number of the wiring layers of the present invention are not especially limited to the ones disclosed in the embodiments.

While the present invention has been described with reference to exemplary embodiments, it is to be understood that the invention is not limited to the disclosed exemplary embodiments. In concrete, modification may be made in the structure according to each of the embodiments. And, a modification to the pixel may also be made, such that a single amplification MOS transistor is commonly used by a plurality of photoelectric conversion elements. The scope of the following claims is to be accorded the broadest interpretation so as to encompass all such modifications and equivalent structures and functions.

This application claims the benefit of Japanese Patent Application No. 2007-189448, filed Jul. 20, 2007, which is hereby incorporated by reference herein in its entirety.

What is claimed is:

1. A photoelectric conversion device, comprising:
   a semiconductor substrate having a photoelectric conversion element, an adjacent element adjacent to the photoelectric conversion element, and an element isolation structure electrically isolating the photoelectric conversion element from the adjacent element;
   a plurality of wiring layers disposed on the semiconductor substrate apart from the semiconductor substrate, the plurality of wiring layers including a first wiring layer and a second wiring layer, the first wiring layer being arranged nearer to the semiconductor substrate than the second wiring layer;
   a plurality of interlayer insulation layers disposed on the semiconductor substrate, the plurality of interlayer insulation layers including a first interlayer insulation layer and a second interlayer insulation layer, the first interlayer insulation layer being arranged nearer to the semiconductor substrate than the second interlayer insulation layer, and the first wiring layer being arranged between the first interlayer insulation layer and the second interlayer insulation layer;
   a region arranged in the plurality of interlayer insulation layers, the region extending from the first interlayer insulation layer to the second interlayer insulation layer, and the region having a refractive index different from refractive indices of the first and second interlayer insulation layers,
   wherein an end of the region, which is a portion closest to the semiconductor substrate, is positioned between (i) a first plane including and being parallel to a surface of the photoelectric conversion element and (ii) a second plane including and being parallel to a lower face of the first wiring layer,
   wherein at least a part of the region is arranged in an area corresponding to the element isolation structure within a third plane being parallel to the first plane; and
   an insulation film having a refractive index between refractive indices of the semiconductor substrate and the first interlayer insulation layer, wherein the insulation film is arranged to cover the photoelectric conversion element and to extend between the element isolation structure and the region,
   wherein the semiconductor substrate has a floating diffusion portion and a channel portion provided between the photoelectric conversion element and the floating diffusion portion, and a gate electrode is arranged on the channel portion so as to provide a transfer MOS transistor for transferring carriers from the photoelectric conversion element to the floating diffusion portion through the channel portion, and
   wherein the insulation film is arranged to extend between the gate electrode and a part of the region.

2. The photoelectric conversion device according to claim 1, wherein the region forms an interface with the first and second interlayer insulation layers, the interface extending in a direction intersecting with the first plane, and the region has such a refractive index that a refractive index difference between the region and the first and second interlayer insulation layers causes a reflection of an incident light to the photoelectric conversion device, at the interface.

3. The photoelectric conversion device according to claim 1, wherein the end of the region contacts the part of the insulation film without the region penetrating through the insulation film in the area corresponding to the element isolation structure.

4. The photoelectric conversion device according to claim 1, wherein the region forms an interface with the first and second interlayer insulation layers, and at least a part of the interface is arranged in the area corresponding to the element isolation structure.

5. The photoelectric conversion device according to claim 1, wherein the region is composed of a gas.

6. The photoelectric conversion device according to claim 1, wherein the region forms an interface with the first and second interlayer insulation layers, and a part of the interface is arranged in the area corresponding to the gate electrode.

7. The photoelectric conversion device according to claim 1, wherein the region is arranged to enclose an area corresponding to at least a part of the photoelectric conversion element, within a plane parallel to the first plane and positioned between the first plane and the second plane.

8. The photoelectric conversion device according to claim 1, wherein the region has a refractive index lower than the refractive indices of the first and second interlayer insulation layers.

9. The photoelectric conversion device according to claim 1, wherein the first wiring layer is arranged nearest to the semiconductor substrate among the plurality of wiring layers.

10. The photoelectric conversion device according to claim 1, wherein the semiconductor substrate is composed of a silicon, the element isolation structure is composed of an insulator, and the insulation film is composed of a silicon nitride and/or a silicon oxynitride, wherein the insulation film is arranged to function as an antireflection film for light incident on the photoelectric conversion element.

11. The photoelectric conversion device according to claim 1, wherein the photoelectric conversion device is incorporated in an imaging system that includes a signal processing unit for processing an imaging signal outputted from the photoelectric conversion device.

12. The photoelectric conversion device according to claim 1, wherein a part of the region is arranged in an area corresponding to the gate electrode within a fourth plane parallel to the first plane.

13. The photoelectric conversion device according to claim 1, wherein the first plane also includes and is parallel to a light receiving surface of the photoelectric conversion element, and the gate electrode is positioned between the first plane and the second plane.

14. The photoelectric conversion device according to claim 1, wherein the region forms an interface with the first and second interlayer insulation layers, and the interface is arranged to enclose an area corresponding to at least a part of the photoelectric conversion element, within a fourth plane parallel to the first plane and positioned between the first plane and the second plane.

* * * * *